DIFFERENTIAL AMPLIFIER
Filed March 22, 1965
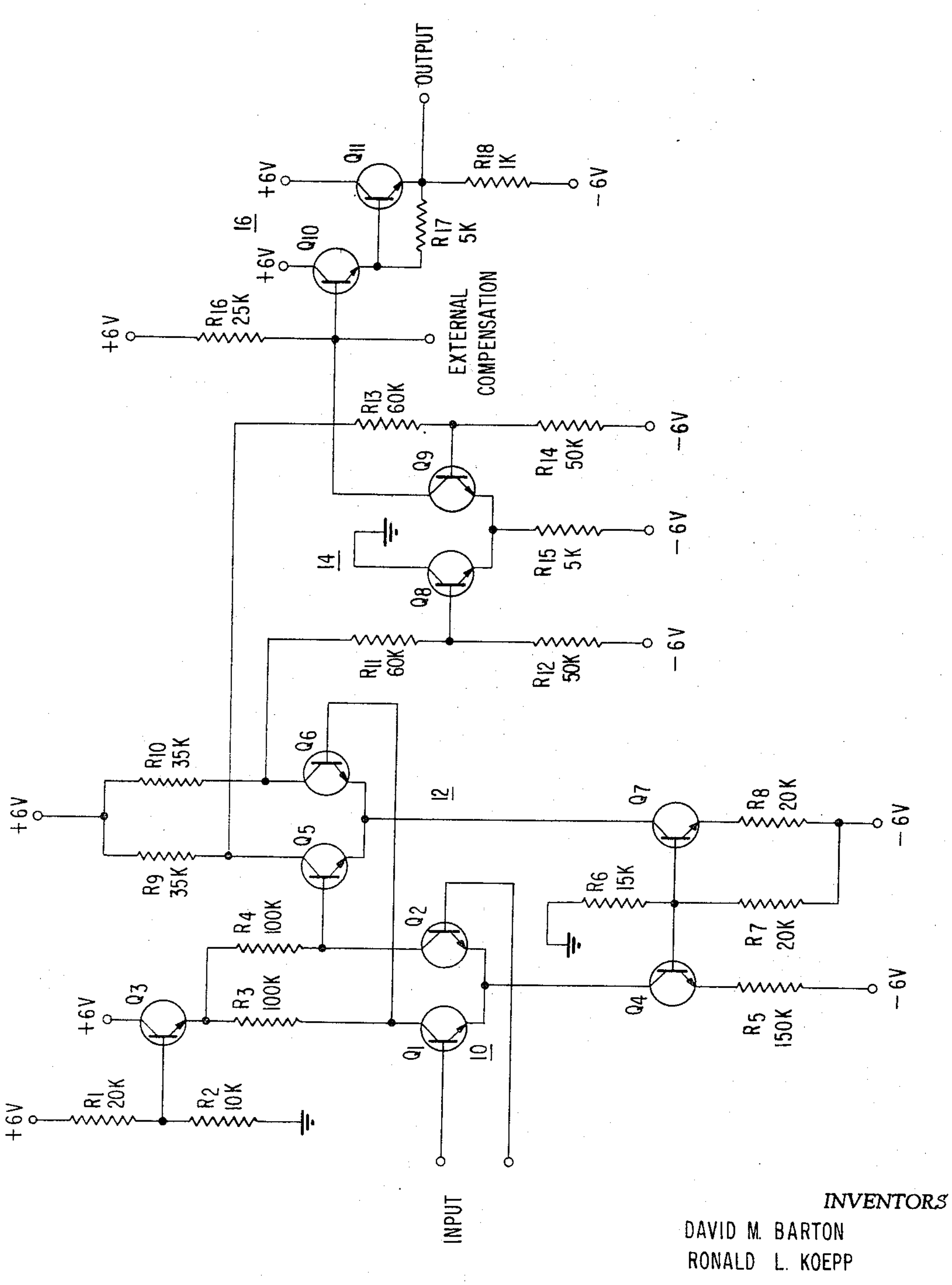
INVENTORS
DAVID M. BARTON
RONALD L. KOEPP
BY Sughrue, Rothwell, Mion, Zinn & Macpeak
ATTORNEYS 3,401,350

DIFFERENTIAL AMPLIFIER

David M. Barton, Bridgeton, and Ronald L. Koepp, Creve Coeur, Mo., assignors to Monsanto Company, St. Louis, Mo., a corporation of Delaware Filed Mar. 22, 1965, Ser. No. 441,557
1 Claim. (Cl. 330—30)

ABSTRACT OF THE DISCLOSURE

A transistorized differential amplifier having high common mode rejection and high differential gain is achieved with a fewer number of stages of amplification. In first and second stages of amplification, constant current generators are connected to common emitter connections to provide high common mode rejection. Also, the differential output impedance of the first stage is made at least 20 times greater than the differential input impedance of the second stage thereby increasing the percentage of the first stage differential output current which drives the second stage of amplification. The latter results in a higher differential gain for the amplifier.

The present invention relates to differential amplifiers and more particularly to transistorized differential amplifiers using all like-conductivity transistors and having a high differential gain and a high common mode rejection.

Differential amplifiers are well known in the art and include circuit means for amplifying the difference between the amplitudes of the signals on two input leads while at the same time being substantially unaffected by a common mode input signal. A common mode signal is one which is applied equally on both input leads. As is well known in the art, common mode signals may be due to various external or internal means, and it is one purpose of most differential amplifiers to substantially reject the common mode signal.

The achievement of high differential gain is also a purpose of most differential amplifiers. One method of achieving a relatively high differential gain is to cascade many stages of differential amplification in the over-all amplifier. However, as the number of differential stages is increased, the cost of the amplifier rises to uneconomical proportions.

It is therefore an object of the present invention to provide a new and improved differential amplifier having a high differential gain and using relatively few stages of amplification.

It is a further object of the present invention to provide a new and useful transistorized differential amplifier having high common mode rejection.

A still further object of the present invention is to provide a new and useful differential amplifier which uses all like-conductivity transistors.

The foregoing and other objects, features and advantages of the invention will be apparent from the following more particular description of a preferred embodiment of the invention, as illustrated in the accompanying drawing.

In the drawing:

The only figure shows a schematic drawing of a preferred embodiment of the differential amplifier of the invention.

Referring to the drawing, there is shown a transistorized differential amplifier having three stages 10, 12 and 14 of differential amplification and an output impedance lowering stage 16. The input leads of the amplifier are connected respectively to the bases of transistors $Q_1$ and $Q_2$ of stage 10. The emitters of transistors $Q_1$ and $Q_2$ are connected together and further connected to the collector of common mode rejection transistor $Q_4$. The purpose of transistor $Q_4$ will be explained hereafter. The emitter of transistor $Q_4$ is connected to negative power supply $-V$ through a resistance $R_5$. In the example shown, resistance $R_5$ is a 150K resistance. The base of $Q_4$ is connected to the power supply $-V$ through resistance $R_7$, and is connected to ground through resistance $R_6$. The collectors of $Q_1$ and $Q_2$ are connected respectively to 100K resistors $R_3$ and $R_4$. Resistances $R_3$ and $R_4$ are connected to the positive supply $+V$ through the collector emitter path of transistor $Q_3$. The base of transistor $Q_3$ is also connected to the positive supply $+V$ through a voltage divider comprising resistances $R_1$ and $R_2$.

The output from stage 10 is applied as inputs to the bases of transistors $Q_5$ and $Q_6$ of stage 12. The emitters of transistors $Q_5$ and $Q_6$ are connected together and also connected to the $-V$ source through the collector emitter path of transistor $Q_7$ and resistance $R_8$. The base of transistor $Q_7$ is biased by the $-V$ source through the voltage divider comprising $R_7$ and $R_6$. The collectors of transistors $Q_5$ and $Q_6$ are connected respectively to the $+V$ source through collector resistance $R_9$ and $R_{10}$.

The outputs from stage 12 are taken from the collectors of transistors $Q_5$ and $Q_6$ and applied to the bases of transistors $Q_8$ and $Q_9$ of stage 14 through the respective voltage dividers $R_{11}$, $R_{12}$, and $R_{13}$, $R_{14}$. The emitters of transistors $Q_8$ and $Q_9$ are connected together and connected to the $-V$ source through a 5K resistor $R_{15}$. The collector of transistor $Q_8$ is grounded allowing a single-ended output from stage 14 to be taken from the collector of $Q_9$. The collector of $Q_9$ is connected to the $+V$ source through a 25K resistance $R_{16}$.

The single-ended output from stage 14 is applied as an input to stage 16 which comprises a double emitter follower connection. The collector of $Q_9$ is connected to the base of transistor $Q_{10}$ which forms the first emitter follower of stage 16. The collector of transistor $Q_{10}$ is connected to the $+V$ source, and the emitter of transistor $Q_{10}$ is connected to the $-V$ source through resistances $R_{17}$ and $R_{18}$. The emitter of transistor $Q_{10}$ is also directly connected as the input to the base of transistor $Q_{11}$ whose collector is connected to the $+V$ source and whose emitter is connected to the $-V$ source through 1K resistance $R_{18}$. The output from the circuit is taken from the emitter of transistor $Q_{11}$. All transistors are shown as NPN transistors but PNP transistors could be used if the power supply were reversed. In actual operation, the optimum power supply used for the values of reactances shown in the drawing is $V=6$ volts.

For a good common mode rejection, the common mode input resistance of each stage should be much greater than the differential input resistance of the same stage. To achieve this purpose, a transistor such as $Q_4$ is connected between the emitters of the amplifying transistors of stage 10 and the $-V$ source. Transistor $Q_4$ acts as a constant current generator to maintain the first stage substantially insensitive to common mode input signals. The common mode input resistance of the first stage may be measured by connecting the two input leads together and measuring the input resistance between the connection and ground. The input resistance which the common mode signal sees is the beta of transistors $Q_1$ and $Q_2$ multiplied by $1/h_{ob}$ of transistor $Q_4$ in parallel with the $1/h_{ob}$ of transistors $Q_1$ and $Q_2$. Beta is the amplification factor of the transistors and $1/h_{ob}$ is the collector impedance of the transistors. Since $1/h_{ob}$ is of the order of tens of megohms, it can be seen that the common mode input resistance is very high. Since the emitters of transistors $Q_1$ and $Q_2$ are tied together, the differential input impedance is $\beta r_{e1}+\beta r_{e2}$, where beta is the amplification factor of the transistors, and $r_{e1}$ and $r_{e2}$ are the emitter impedances of transistors $Q_1$ and $Q_2$, respectively. This value is quite small in comparison with the common mode input impedance.

An example of how the first stage operates to reject common mode signals follows: With $Q_4$ acting as a constant current generator, the total current from the emitters of $Q_1$ and $Q_2$ is constant, and with no input signal, the currents through $R_3$ and $R_4$ are equal providing a zero differential output. If a common mode signal is received by the input leads, the constant current transistor $Q_4$ prevents the current from increasing and since the bases of both transistors $Q_1$ and $Q_2$ receive the same signal, the ratio of the current through $R_3$ and $R_4$ does not change. However, when a differential signal is received, although the total current from the emitters of $Q_1$ and $Q_2$ does not change, the ratio of the current through $R_3$ and $R_4$ does change providing an amplified differential output.

It should be noted that although $Q_4$ is spoken of theoretically as a constant current generator, in fact there is some slight change in the current due to a common mode input signal. To lower the effect upon the next stage of this change in current, it is desired to make $R_3$ and $R_4$ small. It should be seen that the smaller the values of $R_4$ and $R_3$, the smaller will be the voltage change at the collectors of $Q_1$ and $Q_2$ due to a common mode input signal. However, with $+V$ at 6 volts it is necessary to have $R_3$ and $R_4$ relatively large to prevent excessive D.C. currents through the collector emitter paths of $Q_1$ and $Q_2$. A solution to the problem is to provide a transistor such as $Q_3$ between the +6 volt source and the collector resistances of the input transistors. The transistor $Q_3$ in combination with voltage divider $R_1$ and $R_2$ acts to step down the +6 volt source to approximately 1 volt, allowing the use of smaller collector resistances $R_3$ and $R_4$.

As previously explained, the output from the first stage 10 is applied to the second stage 12. Stage 12 also has a high ratio of common mode input impedance to differential mode input impedance. This is due to the use of a constant current transistor connection $Q_7$ which acts in an identical manner to transistor $Q_4$. The output from the second stage 12 is applied to the third stage 14 through voltage dropping resistances $R_{11}$, $R_{12}$ and $R_{13}$, $R_{14}$. Due to the high common mode rejection in stages 10 and 12, there is no need for a constant current transistor to be connected to the emitters of the transistors of stage 14. The voltage dropping resistances $R_{11}$ through $R_{14}$ serve the purpose of lowering the D.C. level input which was progressively raised in the two preceding stages.

The output impedance of the third stage 14 is 25K and therefore it is necessary to step down the impedance. This function is performed by the double emitter stage 16 which steps down the output impedance to about 15 ohms.

To achieve high differential gain with a relatively few stages, it is necessary to have very high differential gain in the first stage of amplification. This is achieved by having the differential input impedance of the second stage much lower than the differential output impedance of the first stage. For example, in the figure shown, the differential input impedance of the second stage 12 is about 10K, whereas the differential output impedance of the first stage of 200K, $R_3$ and $R_4$ in series. Due to the much larger differential output resistance of stage 10, about 95 percent of the differential current at the collectors of $Q_1$ and $Q_2$ flows into the bases of $Q_5$ and $Q_6$. The greater the percentage of the differential signal appearing at the collector of $Q_1$ and $Q_2$ which flows into the bases of transistors $Q_5$ and $Q_6$ of stage 12, the greater the gain of the amplifier. Consequently, due to the very high gain achieved in the first and second stages, 10 and 12, the number of amplification stages necessary to achieve a given gain is reduced.

As seen in FIGURE 1, there is a terminal connected to the collector of $Q_9$ which is designated as the external compensation terminal. This terminal is only necessary if the differential amplifier is used as an operational amplifier with feedback from the output to the input. In such cases, as is well known in the art, it is necessary to provide a passive phase correction network to insure stability and prevent oscillation of the amplifier. The particular passive network which is connected to the external compensation terminal depends upon the intended use of the operational amplifier.

While the invention has been particularly shown and described with reference to a preferred embodiment thereof, it will be understood by those skilled in the art that various changes in form and details may be made therein without departing from the spirit and scope of the invention.

What is claimed is:

1. A transistorized differential amplifier having high differential gain and high common mode rejection comprising, first, second and third stages of differential amplification, said first stage including first, second and third transistors of like conductivity, the emitters of said first and second transistors being connected together and to the collector of said third transistor, means for connecting the emitter of said third transistor to a negative power supply, a first voltage divider connected to said negative supply and the base of said third transistor for biasing said third transistor, a first collector resistance connected at one end to the collector of said first transistor and a second collector resistance connected at one end to the collector of said second transistor, a fourth transistor, the other ends of said first and second collector resistances connected to the emitter of said fourth transistor, means for connecting the collector of said fourth transistor to a positive power supply, means including a second voltage divider network for connecting the base of said fourth transistor to said positive supply, first and second input terminals, said first and second inputs connected respectively to the bases of said first and second transistors, said second stage comprising fifth, sixth and seventh transistors, the emitters of said fifth and sixth transistors being connected together and to the collector of said seventh transistor, the emitter of said seventh transistor being connected to said negative supply through a resistance, means for connecting said first voltage divider to the base of said seventh transistor for biasing said seventh transistor, third and fourth collector resistances connected respectively between said positive supply and the collectors of said fifth and sixth transistors, said third stage comprising first and second inputs and an output, a third voltage divider connected between said first input of said third stage and said negative supply, a fourth voltage divider connected between said second input of said third stage and said negative supply, eighth and ninth transistors having their emitters connected together and to said negative supply, the bases of said eighth and ninth transistors being connected respectively to said third and fourth voltage dividers, means for grounding the collector of said eighth transistor, a fifth collector resistance connected at one end to the collector of said ninth transistor, means for connecting at one end to the collector of said ninth transistor, means for connecting the other end of said fifth collector resistor to said positive supply, and means for connecting the collector of said ninth transistor to said output of said third stage, means for connecting the collectors of said first and second transistors respectively to the bases of said fifth and sixth transistors, means for connecting the collectors of said fifth and sixth transistors respectively to said first and second inputs of said third stage, and means connected to said output of said third stage for lowering the output impedance of said amplifier.

References Cited

UNITED STATES PATENTS

| | | | |
|---|---|---|---|
| 3,182,269 | 5/1965 | Smith | 330—30 |
| 3,327,235 | 6/1967 | Hull | 330—30 XR |

ROY LAKE, *Primary Examiner.*

N. KAUFMAN, *Assistant Examiner.*